United States Patent
Park et al.

[11] Patent Number: 5,815,459
[45] Date of Patent: Sep. 29, 1998

[54] ADDRESS DECODING . . . SEMICONDUCTOR MEMORY

[75] Inventors: Hee-Choul Park; Kook-Hwan Kwon, both of Kyungki-do, Rep. of Korea

[73] Assignee: Samsung Electronics, Co., Ltd., Suwon, Rep. of Korea

[21] Appl. No.: 758,645

[22] Filed: Nov. 27, 1996

[30] Foreign Application Priority Data

Nov. 28, 1995 [KR] Rep. of Korea ................. 1995/44241

[51] Int. Cl.$^6$ ..................................... G11C 8/00
[52] U.S. Cl. ........................ 365/230.06; 365/230.02; 365/230.08; 365/233
[58] Field of Search ................ 365/230.06, 230.02, 365/230.08, 189.02, 189.01, 189.04, 233

[56] References Cited

U.S. PATENT DOCUMENTS

| | | | |
|---|---|---|---|
| 4,876,670 | 10/1989 | Nakabayashi et al. | 365/240 |
| 5,220,529 | 6/1993 | Kohiyama et al. | 365/189.01 |
| 5,369,621 | 11/1994 | Mason | 365/230.06 |
| 5,406,518 | 4/1995 | Sun et al. | 365/189.02 |
| 5,426,612 | 6/1995 | Ichige et al. | 365/230.05 |
| 5,493,536 | 2/1996 | Aoki | 365/230.05 |
| 5,513,139 | 4/1996 | Butler | 365/230.06 |
| 5,596,540 | 1/1997 | Diem et al. | 365/221 |

*Primary Examiner*—Tan T. Nguyen
*Attorney, Agent, or Firm*—Marger, Johnson, McCollom & Stolowitz P.C.

[57] ABSTRACT

Methods and apparatus are disclosed for receiving and decoding address information applied to a synchronous semiconductor memory device. Separate read address and write address decoders and latches are provided for decoding the address without waiting for a determination as to whether a read cycle or a write cycle is undertaken, thereby reducing the decoding delay and thereby increasing the speed of such a device in operation.

10 Claims, 3 Drawing Sheets

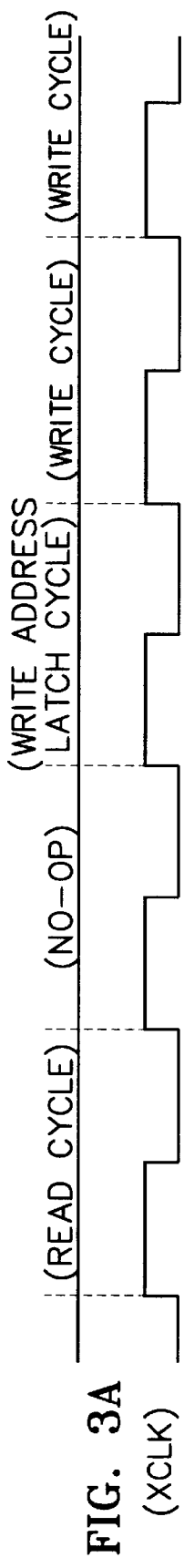
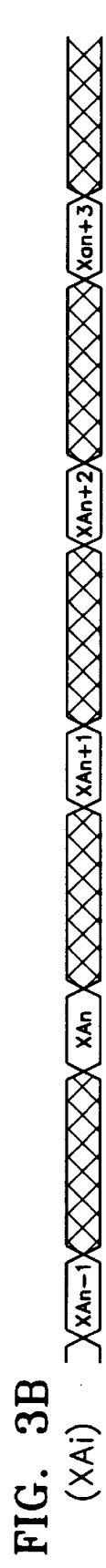
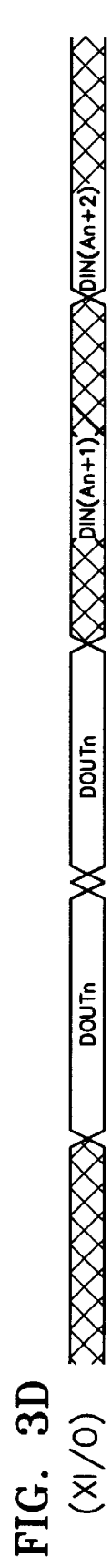
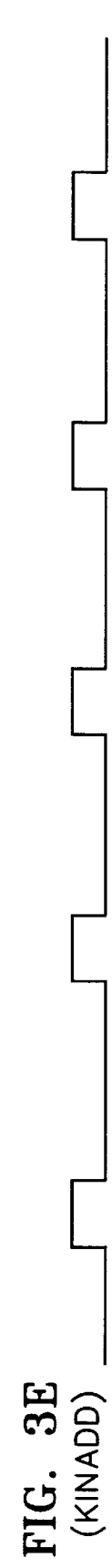
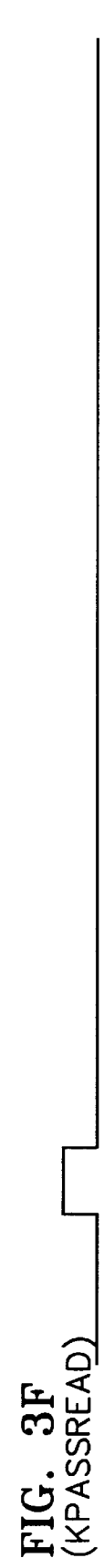
FIG. 3A (XCLK)
FIG. 3B (XAi)
FIG. 3C (XWEB)
FIG. 3D (XI/O)
FIG. 3E (KINADD)
FIG. 3F (KPASSREAD)
FIG. 3G (KPASSWRITE)

ADDRESS DECODING . . .
SEMICONDUCTOR MEMORY

BACKGROUND OF THE INVENTION

1. Field of the Invention

The present invention relates to synchronous semiconductor memory devices and, more specifically, to methods of reducing delay in decoding read and write address information applied to such a memory device.

This application is based on Korean Application No. 44241/1995 which is incorporated herein by reference and based on which applicant claims priority pursuant to 35 USC § 119.

2. Background

Synchronous semiconductor memory devices are known for storing binary data and generally provide for random access to a device for read and write operations. In a synchronous memory device, address information is clocked into an address buffer in response to an external clock signal. The address is then decoded and output to the memory array for accessing corresponding cells of the array. Techniques are known for shortening the clock cycle time in order to reduce delay associated with address decoding in such devices.

Referring to FIG. 1, a conventional address decoding circuit is illustrated. Address data XAi is applied to an address buffer circuit 2, which in turn is coupled to a read address buffer and latch circuit 8. Data from the read address buffer and latch circuit 8 is output to a transmission gate or the like 12, and also to a write address buffer and latch circuit 10. Outputs from the transmission gate 12 and the write address buffer and latch 10 are input to a multiplexer circuit 14 for selecting between the read address and the write address information. The selected address is provided to a decoder circuit 16 for decoding, with the output then provided to the rows of the memory for addressing selected locations.

In FIG. 1, a external clock signal XCLK is input to a clock buffer circuit 4 which provides two internal clock signals. The first internal clock signal KINADD clocks the address buffer 2 to receive the address XAi. A second internal clock signal KINWE clocks a write enable signal XWE/ into a write enable signal buffer circuit 6 that indicates whether the current cycle is a read or a write operation. The write enable buffer 6 outputs one at a time of control signals KPASSREAD and KPASSWRITE accordingly. The KPASSREAD signal is applied to the transmission gate circuit 12 passing the read address information from the read address buffer and latch 8 to the multiplexer 14 during a read cycle. The KPASSREAD signal also is applied to multiplexer 14 as a control signal for selecting the address applied to the MUX from the transmission gate 12. The KPASSWRITE signal is input to the write address buffer and latch 10 for latching write address information and also is input to the multiplexer 14 as a control signal for selecting the write address provided by the latch 10 as the output of the multiplexer 14. Thus the selected address, either a read address or a write address, is selected by the multiplexer 14 and input to the decoder 16.

Thus, in operation of the circuit of FIG. 1, the address buffer always checks to determine whether an applied address XAi is a read address or a write address before decoding. Therefore, the address buffer comprises the read address buffer (8) and the write address buffer (10). This determination is indicated by the write enable signal XWE/. Because the decoding is defered until after selection of read address vs. write address, the effective decoding speed is reduced.

In other words, one of the problems with the prior art as described is that the decoding operation cannot begin until a determination as between read and write cycles has been made, and the corresponding address is selected. The need remains for improvements in semiconductor memory operating speeds by reducing the delay associated with address decoding in a synchronous semiconductor device. It is, therefore, an object of the present invention to provide an improved decoding circuit for a synchronous semiconductor memory device which can increase address decoding speed. In particular, the present invention increases performance of the semiconductor device not by reducing delay in the actual decoding step (in circuit 16), but rather by decoding earlier in the cycle, so that the overall access time of the device is reduced.

SUMMARY OF THE INVENTION

It is therefore another object of the present invention to provide a semiconductor memory device with improved speed of operation by reducing address decoding delay. According to one aspect of the invention, a method of receiving and decoding address information includes the steps of clocking an externally applied address information into an address buffer in response to an external clock signal; decoding the address information to form a decoded read address; latching the decoded read address; and substantially simultaneously decoding the address information to form a decoded write address, so that the address information is decoded without waiting for a read/write determination.

The decoded write address is latched in a write operation; and then the method calls for selecting one of the decoded read address or the decoded write address for output to the memory array. Thus decoding of address information proceeds before the read/write cycle is determined.

According to another feature of the new method, the selecting step includes providing a multiplexer circuit arranged to receive the decoded read address as a first input and the decoded write address as a second input, whereby the multiplexer outputs the selected one of the decoded read address or the decoded write address to the memory the selected one of the decoded read address or the decoded write address to the memory array. Preferably, the multiplexer is controlled by control signal from a write enable buffer responsive to the read or write cycle.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein:

FIGS. 3A–3G are timing diagrams illustrating read and write operations of the circuitry of FIG. 2.

DETAILED DESCRIPTION OF A PREFERRED EMBODIMENT

Figure 1:
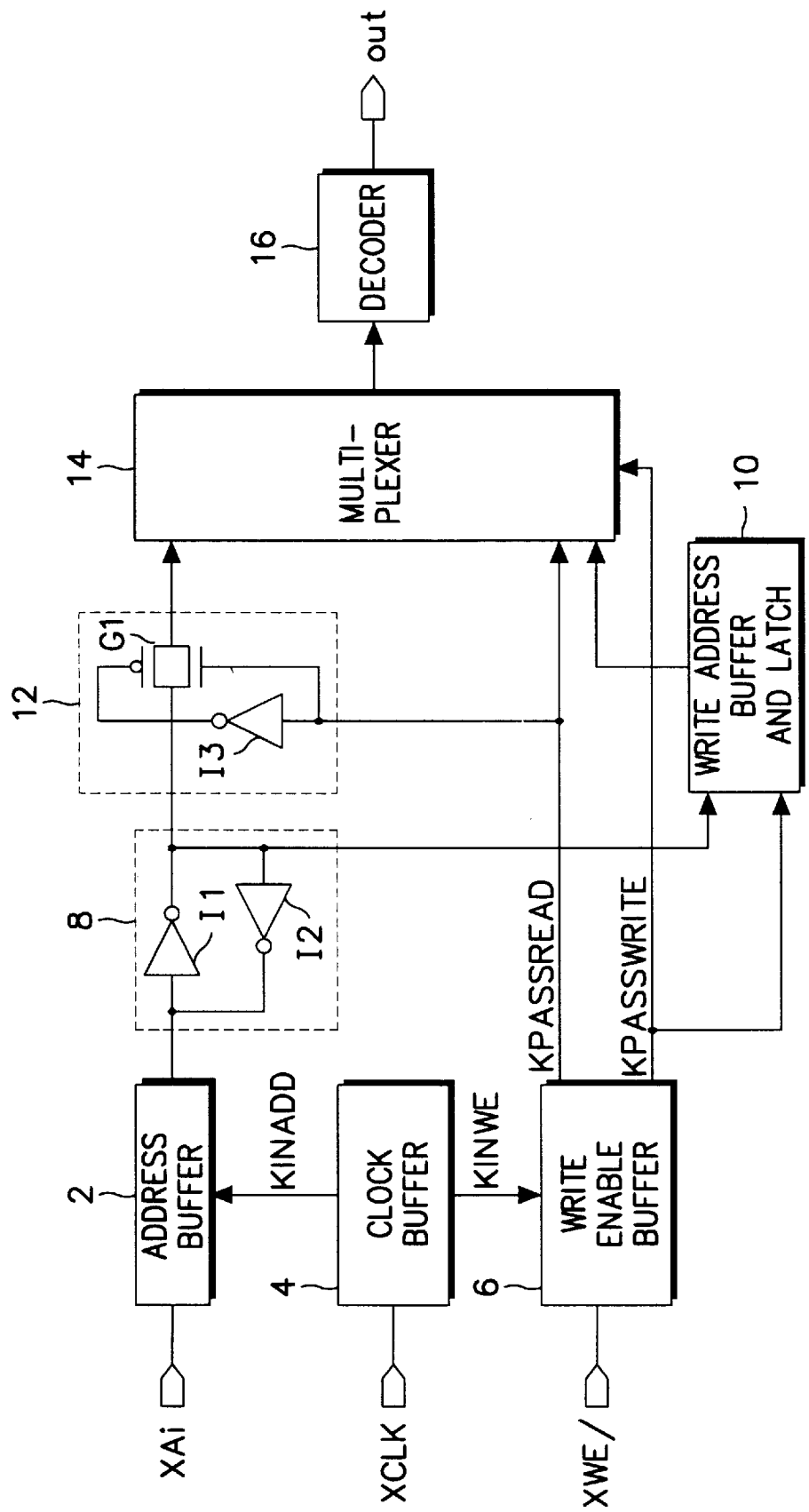
FIG. 1 is a block diagram illustrating a conventional address input and decoding circuit of a synchronous semiconductor memory device.
Figure 2:
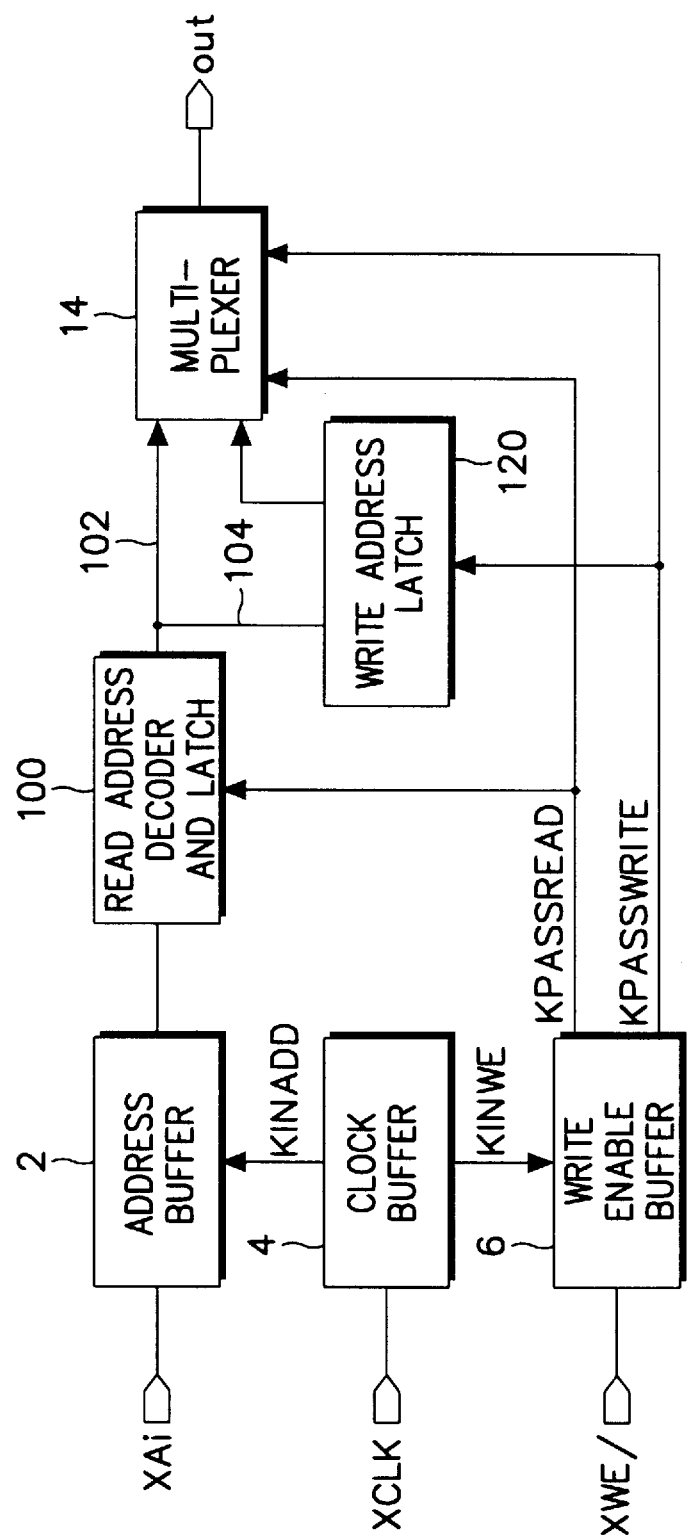
FIG. 2 is a block diagram illustrating an address input and decoding circuit for a synchronous semiconductor memory device according to the present invention.

Referring now to FIG. 2, a block diagram is shown, one embodiment of the present invention for use in a synchronous semiconductor device. Address information XAi is applied to an address buffer 2, a clock signal XCLK drives a clock buffer 4 which in turn provides a clock signal KINCADD to the address buffer 2 to clock in the address information. The address information is then available to a read address decoder and latch circuit 100, which forms a decoded read address. The decoded read address is applied via path 102 to a multiplexer circuit 14. The decoded address information also is input to write address latch circuit 120 to form a decoded write address which is provided to the second input to multiplexer 14. A selected one of the decoded read address and the decoded write address is output by the multiplexer 14 to the memory array for accessing a corresponding address of the array during a read or write cycle, as the case may be.

Synchronization and control of this circuitry is described next. The address XAi is clocked into the address buffer 2 on a rising edge of the externally applied clock signal XCLK. Clock buffer 4 also provides an internal clock signal KNIWE to a write enable buffer 6. This clocks the write enable signal XWE/ into the write enable buffer 6. The write enable buffer 6 asserts a first control signal KPASSREAD if the current cycle is a read cycle. KPASSREAD clocks the read address decoder and latch circuit 100, and also controls the multiplexer 14 to pass the decoded read address (102) to the output. Conversely, if the current cycle is a write cycle, the write enable buffer 6, in response to the KINWE signal, asserts the KPASSWRITE control signal. KPASSWRITE is applied to the write address decoder and decoder and latch circuit 120 to store, as a write address, the output 104 from the read address and decoder circuit 100. The KPASSWRITE control signal also is applied to the multiplexer 14 for selecting the write address from the latch 120 and directing it to the output during a write cycle.

Thus it can be seen that the read/write control signals are asserted to select a read or write address, as appropriate, after the address information is decoded. Put another way, the decoding operation is at least started without waiting for the read/write determination to be made.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment discloses as the best mode contemplated for carrying out the present invention, but that the present invention includes all embodiments falling within the scope of the appended claims.

What is claimed is:

1. In a synchronous semiconductor memory device, a method of receiving and decoding address information comprising the steps of:

clocking externally applied address information into an address buffer in response to an external clock signal;

decoding the address information to form a decoded read address;

latching the decoded read address;

responsive to a write address latch cycle, latching the decoded read address to form a decoded write address and then selecting one of the decoded read address or the decoded write address for output to the memory array.

2. A method according to claim 1 wherein said selecting step includes providing a multiplexer circuit arranged to receive the decoded read address as a first input and the decoded write address as a second input, whereby the multiplexer outputs the selected one of the decoded read address or the decoded write address to the memory array responsive to a write enable signal.

3. A method according to claim 1 including providing a write enable buffer and clocking the write enable signal into the write enable buffer in response to the external clock signal for synchronizing operation of the semiconductor memory device.

4. A method according to claim 1 including:

asserting a first control signal for transmitting the decoded read address to the multiplexer responsive to a read cycle indication of the write enable buffer; and asserting a second control signal for transmitting the decoded write address to the multiplexer responsive to a write cycle indication of the write enable buffer.

5. In a synchronous semiconductor memory device, a method of receiving and decoding address information comprising the steps of:

decoding a received address to form a decoded read address;

transmitting the decoded read address to the memory array for addressing the array in a read cycle;

latching the decoded read address in a write address latch to form a decoded write address responsive to a write enable control signal; and transmitting the decoded write address to the memory array for addressing the array in a write cycle.

6. Address decoding apparatus for use in a semiconductor memory comprising:

an address buffer for receiving an address for accessing the memory;

a read decoder and latch circuit coupled to receive the address from the address buffer;

a write address latch circuit coupled to receive the address from the read decoder; and a selecting means for selecting address information from one of the read decoder latch circuit or the write address latch circuit.

7. Address decoding apparatus according to claim 6 wherein the selecting means includes a multiplexer circuit.

8. Address decoding apparatus according to claim 6 further comprising:

clock means for clocking the received address into the address buffer;

a write enable buffer for indicating a read cycle or a write cycle;

the write enable buffer including means for clocking the read decoder and latch circuit during a read cycle; and the write enable buffer including means for clocking the write address latch circuit during a write cycle.

9. Address decoding apparatus according to claim 8 wherein the means for clocking the read decoder and latch circuit includes a first control signal asserted by the write enable buffer during the said read cycle; and wherein the first control signal is coupled to the selecting means so as to select the decoded read signal during the said read cycle.

10. Address decoding apparatus according to claim 8 wherein the means for clocking the write address latch circuit includes a second control signal asserted by the write enable buffer during the said write cycle; and wherein the second control signal is coupled to the selecting means so as to select the decoded write signal during the said write cycle.

* * * * *

UNITED STATES PATENT AND TRADEMARK OFFICE
CERTIFICATE OF CORRECTION

PATENT NO. : 5,815,459
DATED : September 29, 1998
INVENTOR(S) : Park et al.

It is certified that error appears in the above-identified patent and that said Letters Patent is hereby corrected as shown below:

Title page,
Item [54], Title, "ADDRESS DECODING...SEMICONDUCTOR MEMORY," should read -- ADDRESS DECODING METHOD AND APPARATUS FOR SYNCHRONOUS SEMICONDUCTOR MEMORY --.

Signed and Sealed this

Twenty-fifth Day of January, 2005

JON W. DUDAS
*Director of the United States Patent and Trademark Office*